(12) United States Patent
Audette et al.

(10) Patent No.: US 8,933,717 B2
(45) Date of Patent: Jan. 13, 2015

(54) PROBE-ON-SUBSTRATE

(75) Inventors: David M. Audette, Colchester, VT (US); Kevin Bocash, Essex Junction, VT (US); S. Jay Chey, New York, NY (US); Steven A. Cordes, Yorktown Heights, NY (US); Dustin M. Fregeau, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 300 days.

(21) Appl. No.: 13/528,947

(22) Filed: Jun. 21, 2012

(65) Prior Publication Data

US 2013/0342234 A1    Dec. 26, 2013

(51) Int. Cl.
    *G01R 1/067* (2006.01)
(52) U.S. Cl.
    USPC .................................. 324/755.01; 324/756.03
(58) Field of Classification Search
    USPC ........................................ 324/755.01, 756.03
    See application file for complete search history.

(56) References Cited

U.S. PATENT DOCUMENTS

| | | | |
|---|---|---|---|
| 5,786,701 A | 7/1998 | Pedder | |
| 6,215,321 B1 | 4/2001 | Nakata | |
| 6,891,360 B1 | 5/2005 | Beaman et al. | |
| 7,504,839 B2 | 3/2009 | Feigenbaum et al. | |
| 7,667,471 B2 | 2/2010 | Kurotori et al. | |
| 8,001,685 B2 | 8/2011 | Jo | |
| 2001/0019177 A1 | 9/2001 | Sugihara | |
| 2007/0046304 A1* | 3/2007 | Mok et al. | 324/754 |
| 2010/0039129 A1 | 2/2010 | Park et al. | |
| 2010/0264413 A1* | 10/2010 | Chatterjee et al. | 257/48 |
| 2011/0057678 A1* | 3/2011 | Kato et al. | 324/756.03 |

FOREIGN PATENT DOCUMENTS

| | | |
|---|---|---|
| EP | 838685 A2 | 4/1998 |
| WO | 2004099792 A2 | 11/2004 |

* cited by examiner

*Primary Examiner* — Vincent Q Nguyen
(74) *Attorney, Agent, or Firm* — Scully, Scott, Murphy & Presser, P.C.; Louis J. Percello, Esq.

(57) ABSTRACT

Probes are directly patterned on a test substrate, thereby eliminating a need for an interposer. Probe contact structures are formed as a two-level structure having a greater lateral dimension for a lower level portion than for an upper level portion. First cavities are formed in a masking layer applied to a test substrate, filling the cavities with a conductive material, and planarizing the top surfaces of the conductive material portions to form lower level portions. Another masking layer is applied over the lower level portions and patterned to define second cavities having a smaller lateral dimension that the lower level portions. The second cavities are filled with at least one conductive material to form upper level portions of the probe contact structures. The upper level portion of each probe contact structure can be employed to penetrate a surface oxide of solder balls.

23 Claims, 16 Drawing Sheets

PROBE-ON-SUBSTRATE

BACKGROUND

The present disclosure relates to a probe-on-substrate, and more particularly a probe integrated within a substrate, a method of manufacturing the same, and a method of operating the same.

At a final stage of manufacturing of semiconductor chips, semiconductor chips are tested to ensure that the semiconductor chips have the functionality required by the specification, and to sort out the semiconductor chips that do not meet the specification. A chip testing interposer is typically employed in conjunction with a probe. One side of the probe makes physical contact with C4 solder bumps on a semiconductor chip under test, while the other side of the probe makes contact with a test substrate.

The chip testing interposers currently available are not reliable at the pitch of 3 on 6 configuration or smaller. The 3 on 6 configuration employs solder balls having a diameter of about 3 mils (about 75 microns) and a pitch of about 6 mils (about 150 microns) in a rectangular array. For example, thin film interposers employed to test semiconductor chips are unable to provide reliable performance at 3 on 6 pitches. Further, the cost of operating thin film interposers increases with reduced pitch, and becomes uneconomical at smaller pitches.

BRIEF SUMMARY

Probes are directly patterned on a test substrate, thereby eliminating a need for an interposer. Probe contact structures are formed as a two-level structure having a greater lateral dimension for a lower level portion than for an upper level portion. First cavities are formed in a masking layer applied to a test substrate, filling the cavities with a conductive material, and planarizing the top surfaces of the conductive material portions to form lower level portions. Another masking layer is applied over the lower level portions and patterned to define second cavities having a smaller lateral dimension that the lower level portions. The second cavities are filled with at least one conductive material to form upper level portions of the probe contact structures. The upper level portion of each probe contact structure can be employed to penetrate a surface oxide of solder balls and to provide electrical contacts.

According to an aspect of the present disclosure, a probing apparatus including a plurality of conductive probes located on a top surface of a substrate is provided. Each conductive probe within the plurality of conductive probes includes a first columnar conductive structure and a second columnar conductive structure. The first columnar conductive structure having a same first horizontal cross-sectional area between a topmost surface of the first columnar conductive structure and a bottommost surface of the first columnar conductive structure. The second columnar conductive structure located on the topmost surface of the first columnar conductive structure and having a same second horizontal cross-sectional area between a topmost surface of the second columnar conductive structure and a bottommost surface of the second columnar conductive structure.

According to another aspect of the present disclosure, a method of forming a probing apparatus is provided. A first masking layer is applied over a substrate. The first masking layer is patterned to form a plurality of first cavities extending to a top surface of the substrate. A first conductive material is deposited in the plurality of first cavities. The patterned first masking layer and the deposited first conductive material are planarized to form a plurality of first columnar conductive structures embedded in the patterned first masking layer. A second masking layer is applied over the patterned first masking layer. The second masking layer is patterned to form a plurality of second cavities extending to top surfaces of the plurality of first columnar conductive structures. A second conductive material is deposited in the plurality of second cavities to form a plurality of second columnar conductive structures. A probing apparatus including a plurality of conductive probes located on the substrate is formed, and the plurality of conductive probes includes the plurality of first columnar conductive structures and the plurality of second columnar conductive structures.

DETAILED DESCRIPTION

Figure 1A:
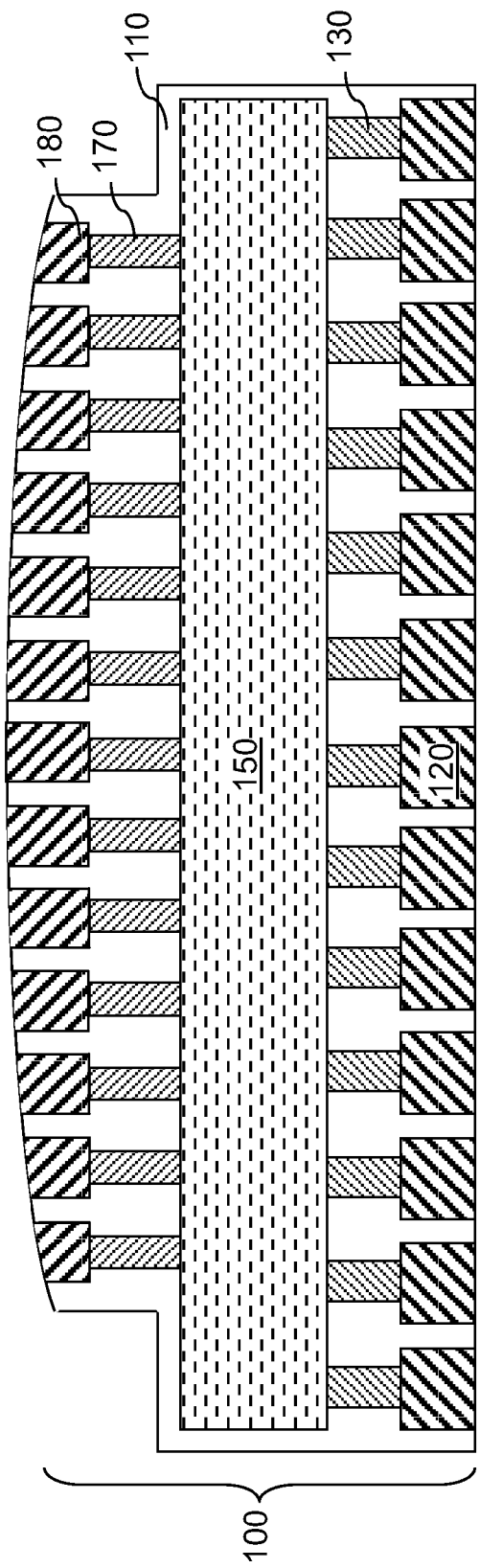
FIG. 1A is a vertical cross-sectional view of an exemplary structure including a substrate according to an embodiment of the present disclosure.

As stated above, the present disclosure relates to a probe integrated within a substrate, a method of manufacturing the same, and a method of operating the same, which are now described in detail with accompanying figures. It is noted that like and corresponding elements are referred to by like reference numerals. The drawings are not drawn to scale.

Figure 1B:
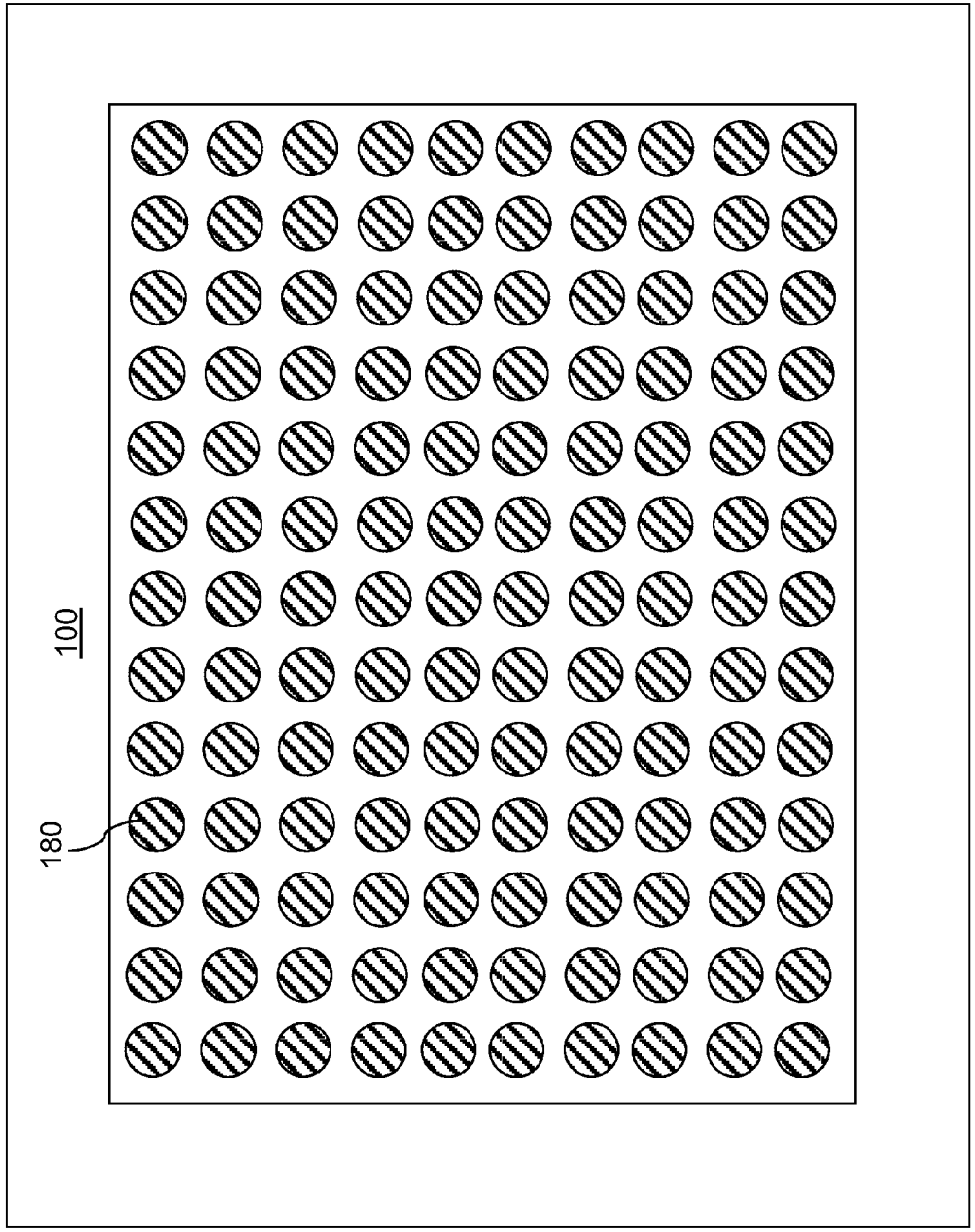
FIG. 1B is a top-down view of the exemplary structure of FIG. 1A.

Referring to FIGS. 1A and 1B, an exemplary structure according to an embodiment of the present disclosure includes a substrate 100. The substrate 100 includes a dielectric material matrix 110 that embeds conductive material portions. In one embodiment, the dielectric material matrix 110 can include a non-organic dielectric material. In one embodiment, the substrate 100 can be a ceramic substrate, and the dielectric material matrix 110 can include a ceramic material. In one embodiment, the dielectric material matrix 110 can consist of a ceramic material. The thickness of the substrate 100 can be, for example, from 1 mm to 3 cm, although lesser and greater thicknesses can also be employed.

The substrate 100 can include an array of first conductive pads 180 that are embedded in the dielectric material matrix 110. A first surface of the substrate 100 located on the top side of the substrate 100 can include surfaces of the array of first conductive pads 180. The array of first conductive pads 180 can include a metallic material such as Cu, Au, Ag, Al, W, WN, TaN, TiN, or combinations thereof. In one embodiment, the array of first conductive pads 180 can be an array of copper pads.

The substrate 100 can further include an array of second conductive pads 120 that are embedded in the dielectric material matrix 110. The surfaces of the array of second conductive pads 120 can be physically exposed on a second surface of the substrate 100. The second surface is located on the opposite side of the first surface of the substrate 100.

The substrate 100 can further include metal interconnect structures 150 embedded in the dielectric material matrix 110. The metal interconnect structures 150 can include metal lines, metal via structures, and a dielectric material embedding the metal lines and the metal via structures. The dielectric material within the metal interconnect structures 150 can be the same as, or can be different from, the dielectric material of the dielectric material matrix 110. In one embodiment, the metal lines and the metal via structures are embedded within the same ceramic material as the dielectric material matrix 110.

The metal lines and the metal via structures within the metal interconnect structures 150 provide electrical connections between the array of first conductive pads 180 and the array of second conductive pads 120. A first array of metal via structures 170 can provide electrically conductive paths between the array of first conductive pads 180 and the metal lines and the metal via structures within the metal interconnect structures 150. A second array of metal via structures 130 can provide electrically conductive paths between the array of second conductive pads 120 and the metal lines and the metal via structures within the metal interconnect structures 150.

The metal interconnect structures 150, in conjunction with the first array of metal via structures 170 and the second array of metal via structures 130, provide electrical connections between the array of first conductive pads 180 and the array of the second conductive pads 120. In one embodiment, the metal interconnect structures 150, in conjunction with the first array of metal via structures 170 and the second array of metal via structures 130, effectively alters the pitch between two arrays of conductive metal pads, i.e., between the array of first conductive pads 180 and the array of the second conductive pads 120.

The array of first conductive pads 180 can have a pitch in at least one direction. In one embodiment, the array of first conductive pads 180 can be a two-dimensional array of first conductive pads 180. In one embodiment, the array of first conductive pads 180 can have the same pitch as the array of solder balls bonded to a semiconductor chip. For example, the array of first conductive pads 180 can have a 4 on 8 pitch, 3 on 6 pitch, 2 on 4 pitch, or any other pitch previous employed or to be employed with an array of solder balls bonded to a semiconductor chip.

The array of second conductive pads 120 can have a pitch in at least one direction. In one embodiment, the array of second conductive pads 120 can be a two-dimensional array of second conductive pads 120. In one embodiment, the array of second conductive pads 120 can have the same pitch as an array of bonding pads on a test card or a printed circuit board. The pitch of the array of the second conductive pads 120 can be greater than the pitch of the array of first conductive pads 180 by a factor greater than 1.0. In one embodiment, the factor can be, for example, from 1.25 to 30, although lesser and greater factors can also be employed. In one embodiment, the factor can be in a range from 2 to 10.

The upper periphery of the substrate 100, i.e., the periphery of the top portion of the substrate 100, can be removed to avoid unintentional contact with semiconductor chips to be tested, or to facilitate the movement of the substrate 100 once the substrate 100 is loaded into a tester as a portion of a probe-on-substrate structure.

The substrate 100 can be formed, for example, by providing a plurality of dielectric material layers embedding a set of metal lines for a single line level, a plurality of dielectric material layers embedding a set of metal via structures within a single via level, a dielectric material layer embedding the array of first conductive pads 180, and a dielectric material layer embedding the array of second conductive pads 120. The various dielectric material layers can be stacked, and subsequently sintered to form the substrate 100.

The first surface, i.e., the top surface, of the substrate 100 may have a built-in curvature, which can be introduced into the first surface during a planarization process intended to provide a horizontal planar surface for the first substrate. For example, if the dielectric material matrix 110 includes a ceramic material, the hardness of the ceramic material and the accompanying difficulty of mechanically planarizing the ceramic material can cause the first surface to develop a convex profile. The differences in height between the center portion of the first surface and the peripheral portion of the first surface may be on the order of up to ten microns.

Figure 2A:
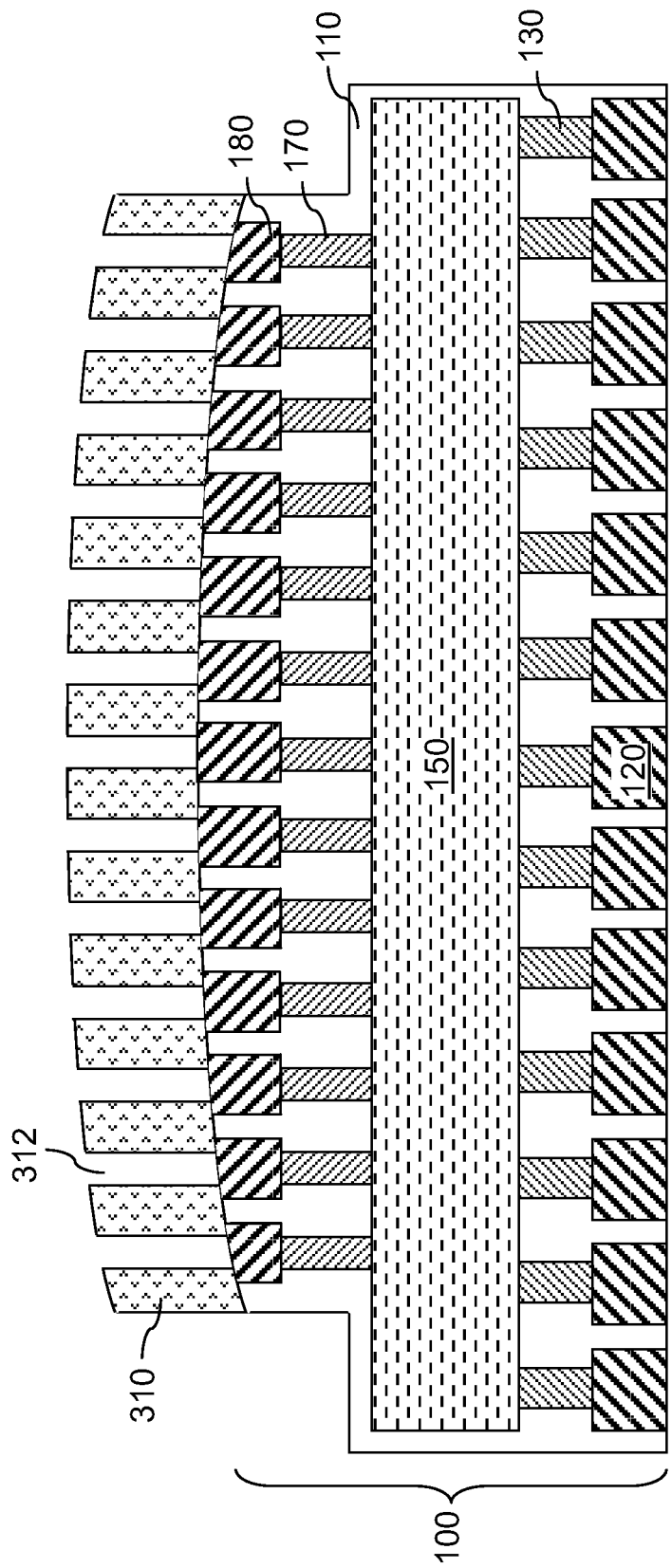
FIG. 2A is a vertical cross-sectional view of the exemplary structure after applying and patterning a first masking layer according to an embodiment of the present disclosure.
Figure 2B:
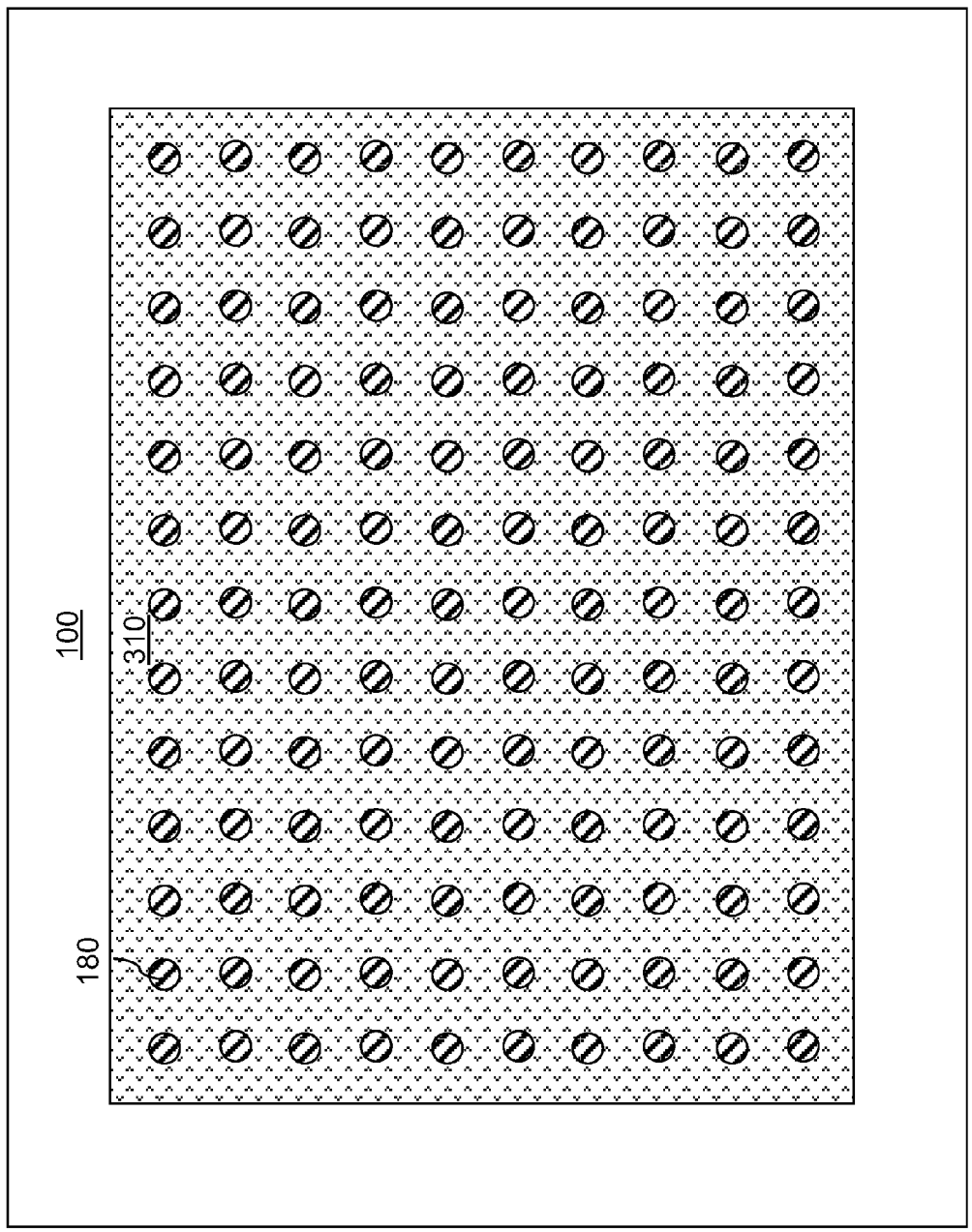
FIG. 2B is a top-down view of the exemplary structure of FIG. 2A.

Referring to FIGS. 2A and 2B, a first masking layer 310 is applied over the first surface of the substrate 100, and is subsequently patterned with a pattern that includes a plurality of first cavities 312.

In one embodiment, the first masking layer 310 can be a first photoresist layer, which is lithographically exposed and developed by lithographic methods known in the art. For example, the first mask layer 310 can be a layer of mid-ultraviolet (MUV) photoresist. The thickness of the first photoresist layer of the first masking layer 310 can be from 3 micron to 60 microns, although lesser and greater thicknesses can also be employed.

In another embodiment, the first masking layer 310 can be at least one dielectric material layer and/or at least one semiconductor material layer. For example, the first masking layer 310 can include at least one layer of silicon oxide, silicon nitride, silicon oxynitride, amorphous or polycrystalline silicon or silicon-containing alloy, and amorphous carbon. In this embodiment, the first masking layer 310 can be patterned by applying a photoresist layer (not shown) over the first masking layer 310, lithographically patterning the photoresist layer, and subsequently transferring the pattern in the photoresist layer into the first masking layer 310 by an etch, which can be an anisotropic etch. The photoresist layer may be subsequently removed, for example, by ashing. The thickness of the at least one dielectric material layer and/or the at least one semiconductor material layer of the first masking layer 310 can be from 3 micron to 60 microns, although lesser and greater thicknesses can also be employed.

Each of the first cavities 312 extends to the first surface, i.e., the top surface, of the substrate 100. A surface of a first conductive pad 180 can be physically exposed at the bottom of each first cavity 180. Each of the plurality of first cavities 312 can have vertical sidewalls. In one embodiment, the horizontal cross-sectional area of each first cavity 312 can be the same between the bottom surface of the first cavity 312 (which coincide with a top surface of a first conductive pad 180) and a topmost region of the first cavity 312 (which is at the level of the top surface of the first masking layer 310). In one embodiment, each first cavity 312 can have a horizontal cross-sectional shape of a circle. In this case, each first cavity 312 is a circular cylindrical cavity.

In one embodiment, the first horizontal cross-sectional area of each first cavity 310 can be in a range from 400 square microns to 30,000 square microns, although lesser and greater areas can also be employed.

Figure 3A:
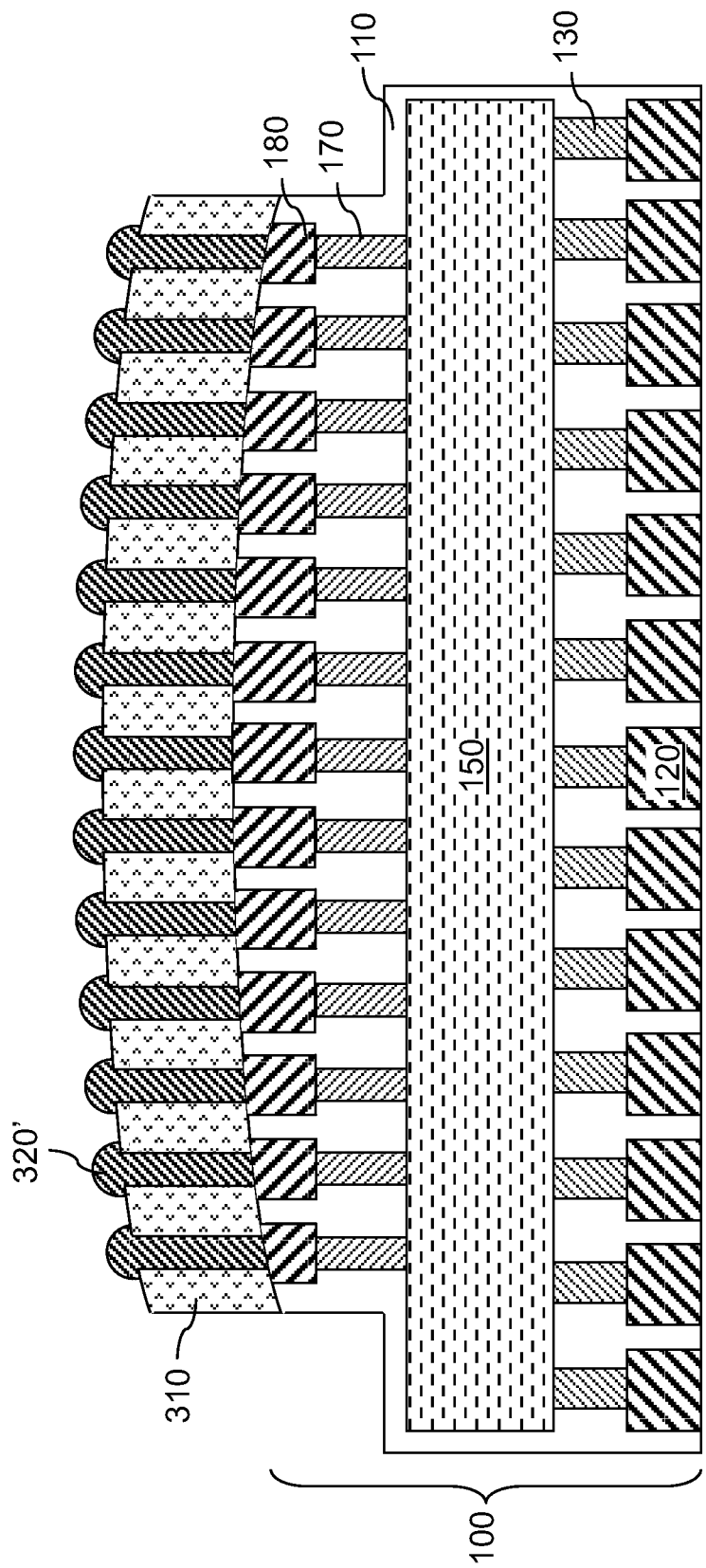
FIG. 3A is a vertical cross-sectional view of the exemplary structure after deposition of a first conductive material according to an embodiment of the present disclosure.
Figure 3B:
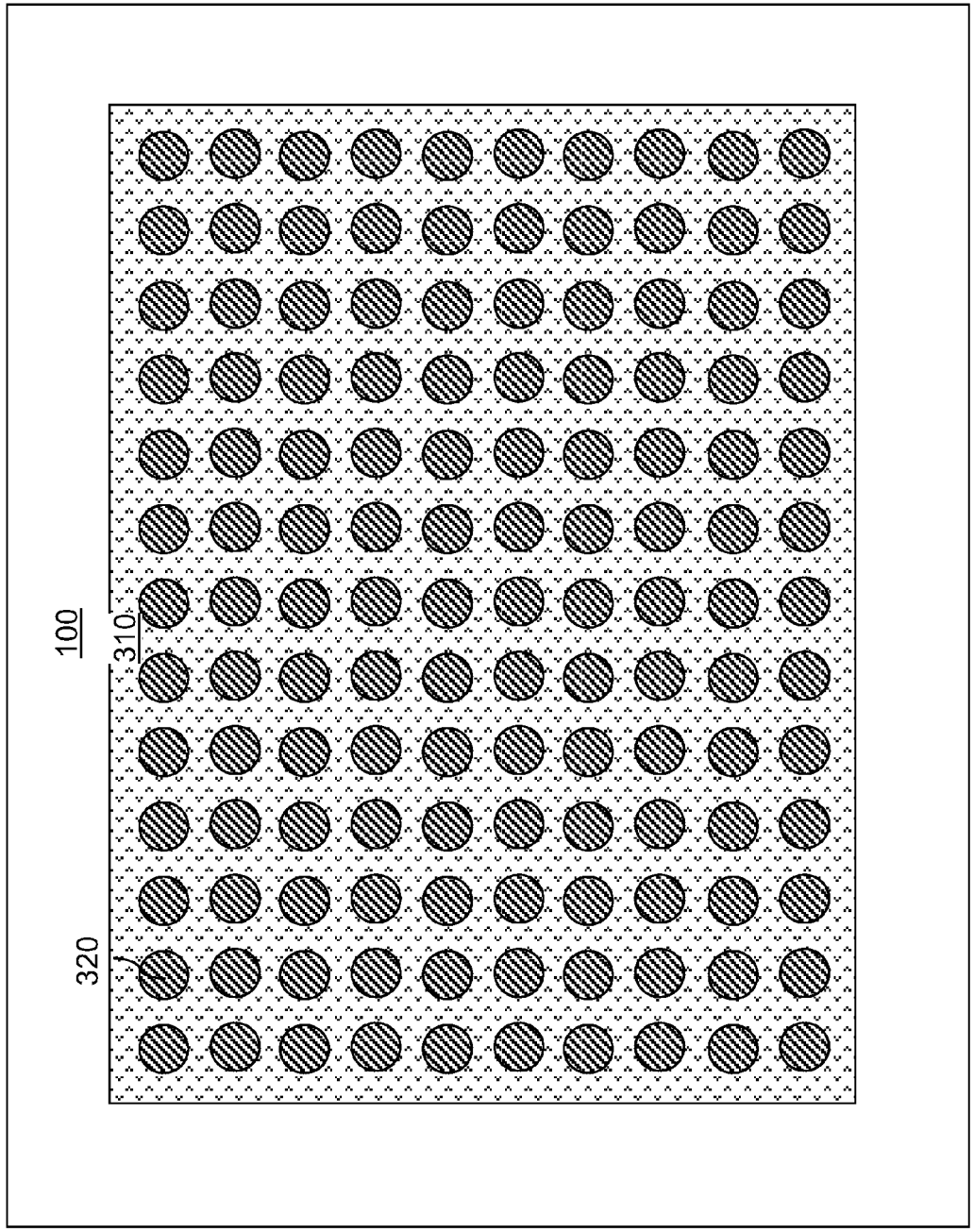
FIG. 3B is a top-down view of the exemplary structure of FIG. 3A.

Referring to FIGS. 3A and 3B, a first conductive material can be deposited within each of the first cavities 312. In one embodiment, the deposition of the first conductive material in the plurality of first cavities 312 can be performed by electroplating the first conductive material in the plurality of first cavities 312 up to, and above, the topmost surface of the first masking layer 310. Each first cavity 312 is filled by a first conductive material to form a first conductive material portion 320' therein. Each first conductive material portion 320' includes a lower portion, which is a first columnar conductive structure and fills a first cavity 312, and an upper portion that overlies the first masking layer 310. If the horizontal cross-sectional area of a first cavity 312 is circular, the shape of the upper portion of a first conductive material portion 320' overlying the first cavity 312 can be hemispherical. In one embodiment, the electroplating process can stop before the first conductive material portions 320' can merge into a contiguous sheet over the first masking layer 310.

The first conductive material can be any material that can be electroplated. In one embodiment, the first conductive material can include at least one of Cu, Ni, Co, Au, Ag, and Sn.

In one embodiment, the first conductive material can be Cu. In this case, the electroplated copper material can include impurities of O, N, C, Cl, and S due to the nature of the plating process. The sum of concentrations of O, N, C, Cl, and S is typically from about 1 parts per million (ppm) to about 200 ppm. In one embodiment, a superfill (bottom-up fill) process can be employed to prevent formation of any seam within each first cavity 312 so that each first conductive material portion 320' is free of any cavity therein. Electrolytically plated Cu includes some atomic scale voids. In one embodiment, the density of electrolytically plated Cu is about 8.91 g/cm$^3$ at room temperature, which is marginally lower than the density of Cu in normal elemental form, which is 8.92 to 8.96 g/cm$^3$ at room temperature.

In one embodiment, the first conductive material can be Ni.

Figure 4A:
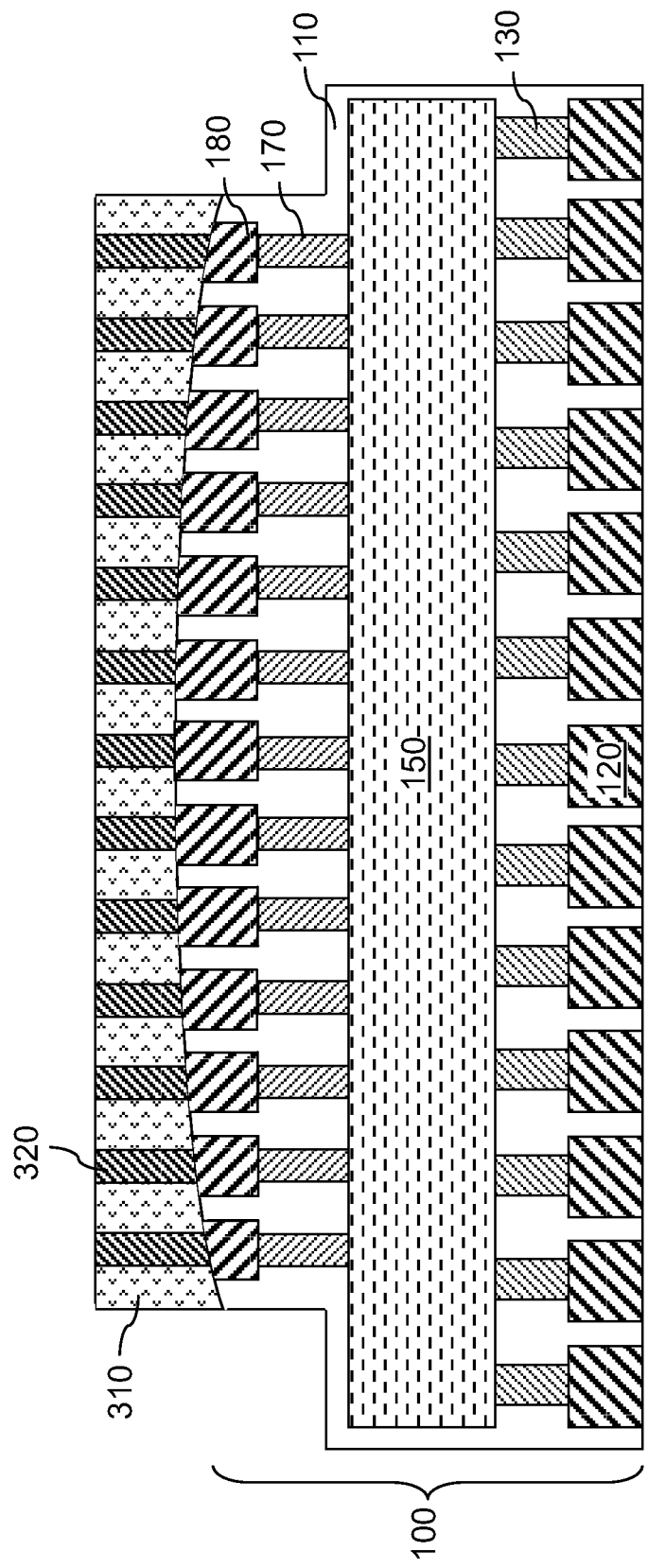
FIG. 4A is a vertical cross-sectional view of the exemplary structure after planarization of the first masking layer and the first conductive material to form first columnar conductive structures according to an embodiment of the present disclosure.
Figure 4B:
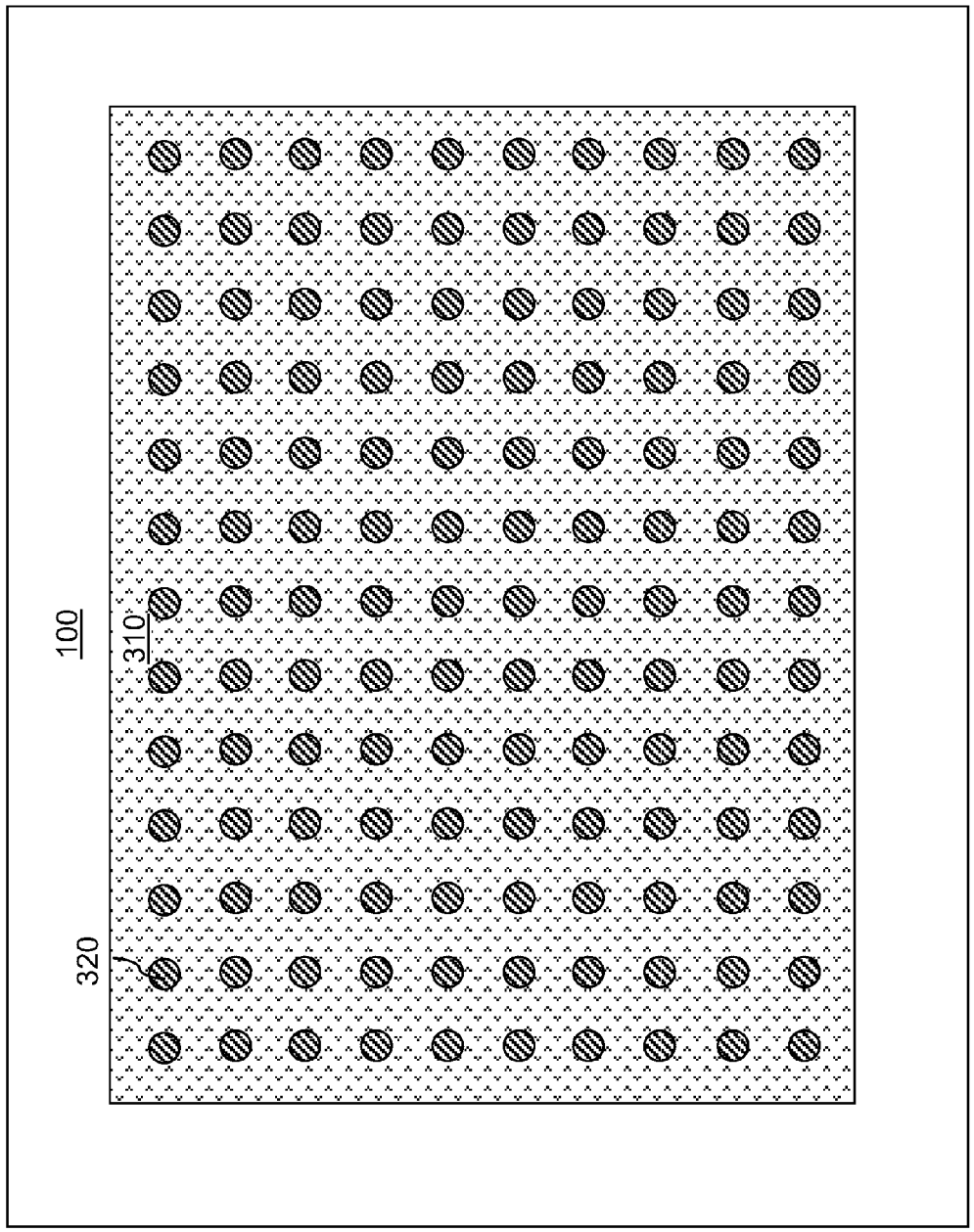
FIG. 4B is a top-down view of the exemplary structure of FIG. 4A.

Referring to FIGS. 4A and 4B, the first masking layer 310 and the first conductive material of the first conductive material portions 320' can be planarized. Specifically, the material of the first masking layer 310 and the first conductive material of the first conductive material portions 320' are removed from above the topmost surface of the first masking layer. Further, the material of the first masking layer 310 and the first conductive material of the first conductive material portions 320' can be further recessed so that the material of the first masking layer 310 and the first conductive material of the first conductive material portions 320' are removed from above a horizontal plane, of which the height can be selected to be below the lowest portion of the top surface of the patterned first masking layer 310 in FIGS. 3A and 3B and above the topmost portion of the first surface of the substrate 100.

Any method of removing materials from above a horizontal plane can be employed to planarize the first masking layer 310 and the first conductive material of the first conductive material portions 320'. For example, the first masking layer 310 and the first conductive material of the first conductive material portions 320' can be planarized by at least one of chemical mechanical planarization, mechanical milling, and fly cutting.

The remaining portions of the first masking layer 310 and the first conductive material of the first conductive material portions 320' have a planar horizontal top surface. The planarity of the top surfaces of the plurality of first columnar conductive structures 320 and the remaining portions of the first masking layer 310 can be limited by the inherent controllability employed to planarize the first masking layer 310 and the first conductive material of the first conductive material portions 320'. As used herein, a "planar" horizontal top surface is a top surface that can be approximated by a horizontal plane, and having a planarity limited by inherent process non-uniformity of a planarization process employed to form the top surface. In one embodiment, the variations in height of the planar horizontal top surface of the remaining portions of the first masking layer 310 and the first conductive material of the first conductive material portions 320' can be less than +/−1 micron.

The remaining portions of the first conductive material portions 320' are herein referred to as first columnar conductive structures 320, which are embedded within the remaining portion of the patterned first masking layer 310. After the planarization, the distance between the horizontal plane of planarization and the topmost portion of the first surface of the substrate 100 can be from 3 microns to 60 microns, although lesser and greater distances can also be employed.

In one embodiment, each of the plurality of first columnar conductive structures 320 can be formed with a same first horizontal cross-sectional area between the topmost surface of the first columnar conductive structure 320 and the bottommost surface of the first columnar conductive structure 320. In this case, each first columnar conductive structure 320 can be a cylindrical structure having the same first horizontal cross-sectional area irrespective of the height of the horizontal cross-section.

Figure 5A:
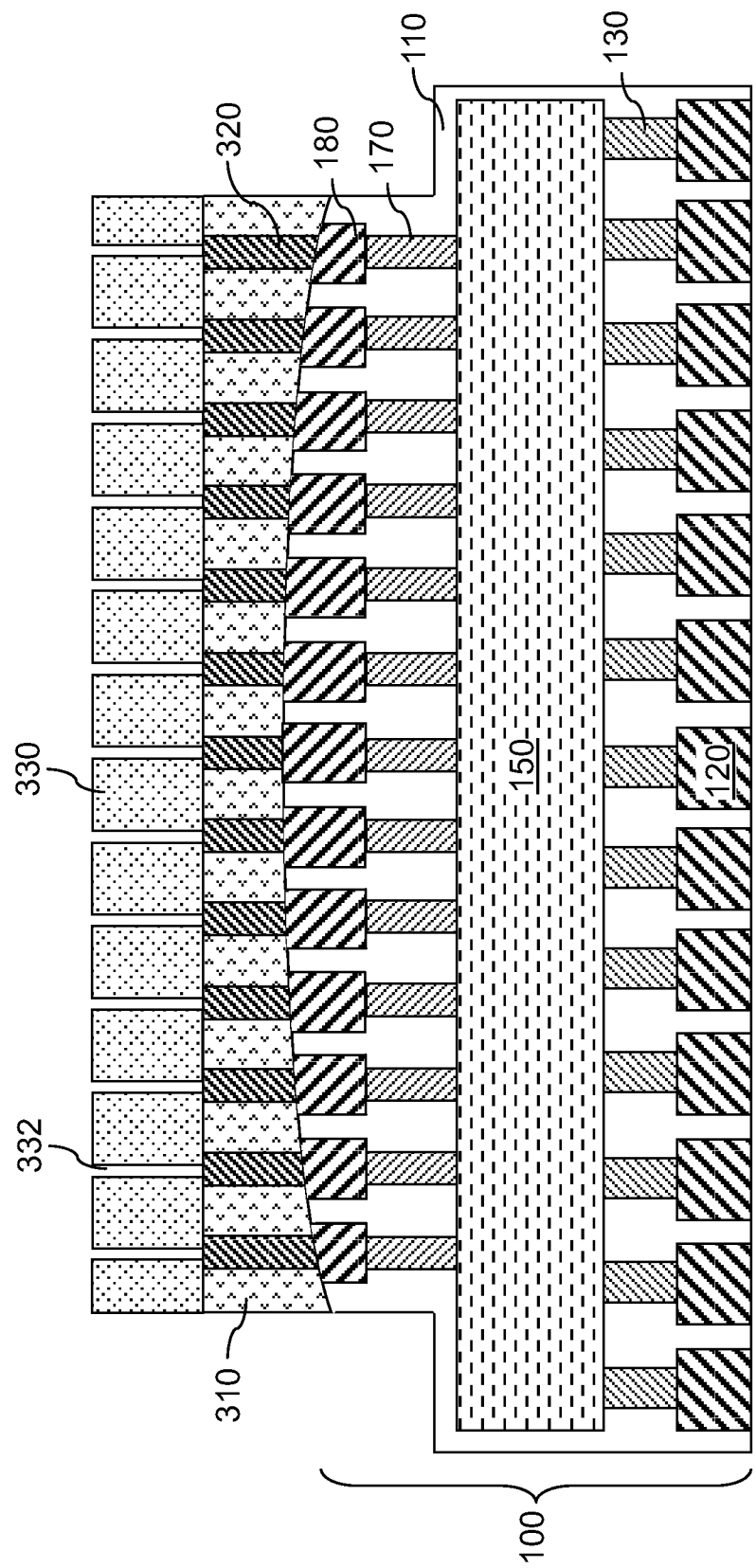
FIG. 5A is a vertical cross-sectional view of the exemplary structure after applying and patterning a second masking layer according to an embodiment of the present disclosure.
Figure 5B:
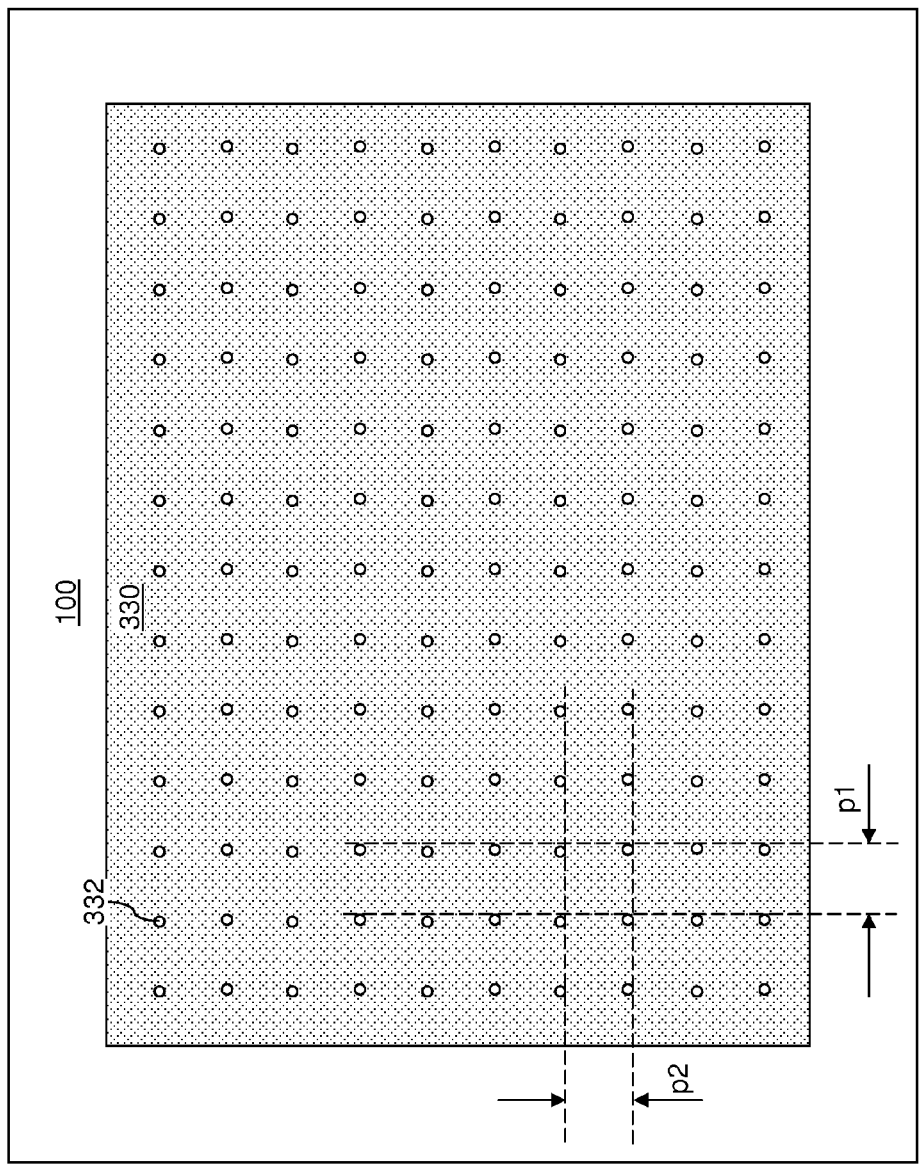
FIG. 5B is a top-down view of the exemplary structure of FIG. 5A.

Referring to FIGS. 5A and 5B, a second masking layer 330 is applied over the planar top surface of the patterned first masking layer 310 and the plurality of first columnar conductive structure 320 embedded therein, and is subsequently patterned with a pattern that includes a plurality of second cavities 332.

In one embodiment, the second masking layer 330 can be a second photoresist layer, which is lithographically exposed and developed by lithographic methods known in the art. For example, the second mask layer 330 can be a layer of mid-ultraviolet (MUV) photoresist. The thickness of the second photoresist layer of the second masking layer 330 can be from 6 micron to 60 microns, although lesser and greater thicknesses can also be employed. In one embodiment, the patterned first masking layer 310 can be a first photoresist layer or a layer including at least one dielectric material layer and/or at least one semiconductor material layer, and the second masking layer 330 can be a second photoresist layer.

In another embodiment, the second masking layer 330 can be at least one dielectric material layer and/or at least one semiconductor material layer. For example, the second masking layer 330 can include at least one layer of silicon oxide, silicon nitride, silicon oxynitride, amorphous or polycrystalline silicon or silicon-containing alloy, and amorphous carbon. In this embodiment, the second masking layer 330 can be patterned by applying a photoresist layer (not shown) over the second masking layer 330, lithographically patterning the photoresist layer, and subsequently transferring the pattern in the photoresist layer into the second masking layer 330 by an etch, which can be an anisotropic etch. The photoresist layer may be subsequently removed, for example, by ashing. The thickness of the at least one dielectric material layer and/or the at least one semiconductor material layer of the second masking layer 330 can be from 6 micron to 60 microns, although lesser and greater thicknesses can also be employed. In one embodiment, the patterned first masking layer 310 can be a layer including at least one dielectric material layer and/or at least one semiconductor material layer, and the second masking layer 330 can be a photoresist layer.

Each of the second cavities 332 can extend to a top surface of a first columnar conductive structure 320. A surface of a first columnar conductive structure 320 can be physically exposed at the bottom of each second cavity 332. Each of the plurality of second cavities 332 can have vertical sidewalls. In one embodiment, the horizontal cross-sectional area of each second cavity 332 can be the same between the bottom surface of the second cavity 332 (which coincide with a top surface of a first columnar conductive structure 320) and a topmost region of the second cavity 332 (which is at the level of the top surface of the second masking layer 330). In one embodiment, each second cavity 332 can have a horizontal cross-sectional shape of a circle. In this case, each second cavity 332 is a circular cylindrical cavity.

In one embodiment, all bottom surfaces of the plurality of second cavities 332 can coincide with portions of top surfaces of the plurality of first columnar conductive structures 320.

In one embodiment, the second horizontal cross-sectional area of each second cavity 332 can be less than the first horizontal cross-sectional area of the first columnar conductive structure 320 that underlies the second cavity 332.

In one embodiment, the horizontal cross-sectional area of each first columnar conductive structure 320 can have a shape of a first circle, and the second horizontal cross-sectional area of each second cavity 332 can have a shape of a second circle, and the entirety of the shape of the second circle can be within the shape of the first circle.

In one embodiment, the second horizontal cross-sectional area of each second cavity can be in a range from 25 square microns to 1,000 square microns, although lesser and greater areas can also be employed.

Figure 6:
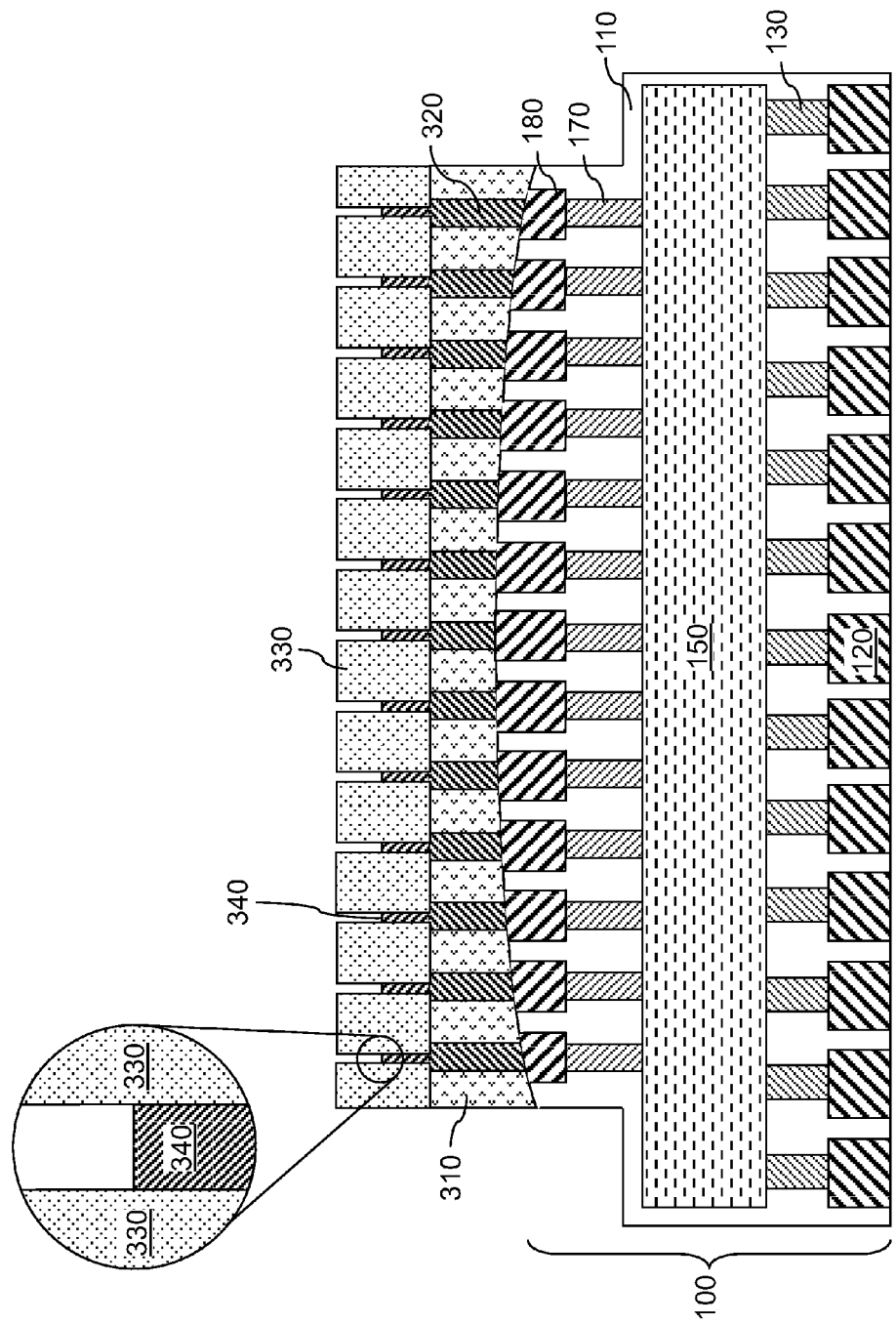
FIG. 6 is a vertical cross-sectional view of the exemplary structure after deposition of a second conductive material to form second columnar conductive structures according to an embodiment of the present disclosure.

Referring to FIG. 6, a second conductive material can be deposited within each of the second cavities 332. In one embodiment, the deposition of the second conductive material in the plurality of second cavities 332 can be performed by electroplating the second conductive material in the plurality of second cavities 332 to a height below the topmost surface of the second masking layer 330. The duration of the electroplating process can be selected so that a lower portion of each second cavity 332 is filled by a second columnar conductive structure 340, and an upper portion of each second cavity 332 is not filled by the second conductive material. If the horizontal cross-sectional area of a second cavity 332 is circular, the horizontal cross-sectional area of the second columnar conductive structure 340 formed therein can also be circular.

The second conductive material can be any material that can be electroplated. The second conductive material can be the same as, or different from, the first conductive material of the plurality of first columnar conductive structures 320. In one embodiment, the second conductive material can include at least one of Cu, Ni, Co, Au, Ag, and Sn.

In one embodiment, the second conductive material can be Cu. In this case, the electroplated copper material can include impurities of O, N, C, Cl, and S due to the nature of the plating process as discussed above. In one embodiment, a superfill (bottom-up fill) process can be employed to prevent formation of any seam within each second columnar conductive structure 340.

In one embodiment, the second conductive material can be Ni.

Each of the second columnar conductive structure 340 can be formed directly on a top surface of a first columnar conductive structure 320.

In one embodiment, each of the plurality of second columnar conductive structures 340 can be formed with a same second horizontal cross-sectional area between the topmost surface of the second columnar conductive structure 340 and a bottommost surface of the second columnar conductive structure 340. For each second columnar conductive structure 340, the second horizontal cross-sectional area can be less than the first horizontal cross-sectional area of the underlying first columnar conductive structure 320.

In one embodiment, each of the plurality of conductive probes can be formed as a first cylindrical conductive structure. Further, each of the plurality of conductive probes can be formed as a second cylindrical conductive structure.

In one embodiment, the plurality of second columnar conductive structures 340 can have a same height, which can be in a range from, and including, 5 microns to, and including, 50 microns. In one embodiment, the plurality of second columnar conductive structures 340 can have a same height, which can be in a range from, and including, 10 microns to, and including, 30 microns. In one embodiment, the plurality of second columnar conductive structures 340 can have the same second horizontal cross-sectional area, which can be a value selected from a range from 25 square microns to 1,000 square microns.

In one embodiment, the plurality of second columnar conductive structures 340 can be formed as an array having a pitch in at least one direction. In one embodiment, the plurality of second columnar conductive structures 340 can be formed as a two-dimensional array having a first pitch p1 in a first direction, and a second pitch p1 in a second direction (see FIG. 5B). The first pitch and the second pitch can be the same, or can be different.

Figure 7:
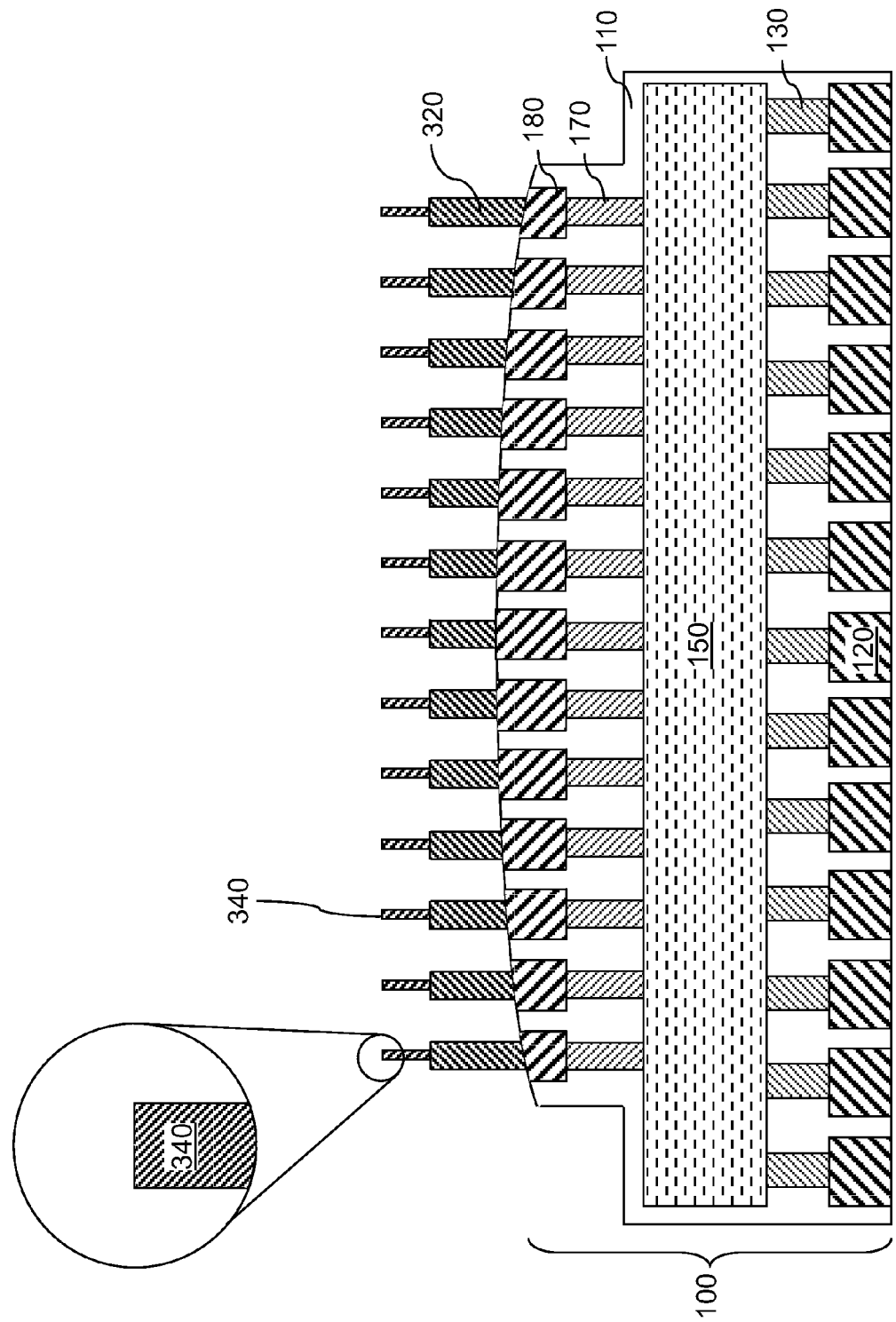
FIG. 7 is a vertical cross-sectional view of the exemplar structure after removal of the second masking layer and the first masking layer according to an embodiment of the present disclosure.

Referring to FIG. 7, the second masking layer 330 and the first masking layer 310 are removed, for example, by ashing (if the second masking layer 330 and/or the first masking layer 310 include a photoresist layer) or by an etch such as a wet etch. The resulting structure is a probing apparatus (100, 320, 340) including a plurality of conductive probes (320, 340) located on the substrate 100. The plurality of conductive probes (320, 340) includes the plurality of first columnar conductive structures 320 and the plurality of second columnar conductive structures 340.

Each conductive probe (320, 340) within the plurality of conductive probes includes a first columnar conductive structure 320 having a same first horizontal cross-sectional area between a topmost surface of the first columnar conductive structure 320 and a bottommost surface of the first columnar conductive structure 320, and a second columnar conductive structure 340 located on the topmost surface of the first columnar conductive structure 320 and having a same second horizontal cross-sectional area between the topmost surface of the second columnar conductive structure 340 and the bottommost surface of the second columnar conductive structure 340. As discussed above, the second horizontal cross-sectional area can be less than the first horizontal cross-sectional area.

In one embodiment, the first columnar conductive structures 320 of the plurality of conductive probes (320, 340) can be first cylindrical conductive structures, and the second columnar conductive structures 340 of the plurality of conductive probes (320, 340) can be second cylindrical conductive structures.

In one embodiment, the second columnar conductive structures 340 of the plurality of conductive probes (320, 340) can have a same height, which is herein referred to as a second height. In one embodiment, the second height can be in a range from, and including, 5 microns to, and including, 50 microns. In one embodiment, the second height can be in a range from, and including, 10 microns to, and including, 30 microns.

The second height is the upper limit of the penetration length by which the second columnar conductive structures 340 can penetrate a solder ball (such as a C4 ball) on a semiconductor chip during testing. The second height can be is designed and/or scaled to accommodate and overcome the flatness and coplanarity tolerance of a test system in a stressed condition. The coplanarity tolerance during testing is typically from about 15 microns to 25 microns, and may be scaled to a value less than 10 microns in the future.

In one embodiment, the second horizontal cross-sectional area of the second columnar conductive structures 340 can be in a range from 25 square microns to 1,000 square microns. In one embodiment, the second columnar conductive structures 340 can be cylindrical structures having a circular horizontal cross-sectional area. The diameter of the second columnar conductive structures 340 can be designed and/or scaled to provide suitable force to solder balls for each type of solder balls. For example, the diameter of the second columnar conductive structures 340 can be determined based on the hardness of the material of the solder balls, and the available system force that a probing apparatus can provide, and required penetration length (depth) into the solder balls to ensure good electrical contact. The deformation of solder balls as a function of load (applied force) can be considered to determine the optimum diameter of the diameter of the second columnar conductive structures 340.

In one embodiment, the plurality of conductive probes (320, 340) can be arranged as an array of conductive probes (320, 340) having a pitch in at least one direction. In one embodiment, the pitch can be in a range from 20 microns to 500 microns.

In one embodiment, the array of conductive probes (320, 340) can be a two-dimensional array having a first pitch in a first direction and a second pitch in a second direction that is different from the first direction. In one embodiment, each of the first pitch and the second pitch can have a value independently selected from a range from 20 microns to 500 microns. In one embodiment, the first pitch and the second pitch can be the same. In one embodiment, the direction of the first pitch and the direction of the second pitch can be orthogonal.

In one embodiment, all topmost surfaces of the first columnar conductive structures 320 can be within a horizontal plane, and the first surface (i.e., the top surface) of the substrate 100 can be curved. In this case, the first columnar conductive structures 320 have variations in height.

In one embodiment, the second columnar conductive structures 340 can have the same height. Each of the first columnar conductive structure 320 and the second columnar conductive structure 340 within a conductive probe (320, 340) can includes at least one of Cu, Ni, Pd, Ni, Co, and alloys thereof.

In one embodiment, each conductive probe (320, 340) within the plurality of conductive probes (320, 340) can be in contact with a surface of a first conductive pad 180 in the array of first conductive pads 180.

Figure 8:
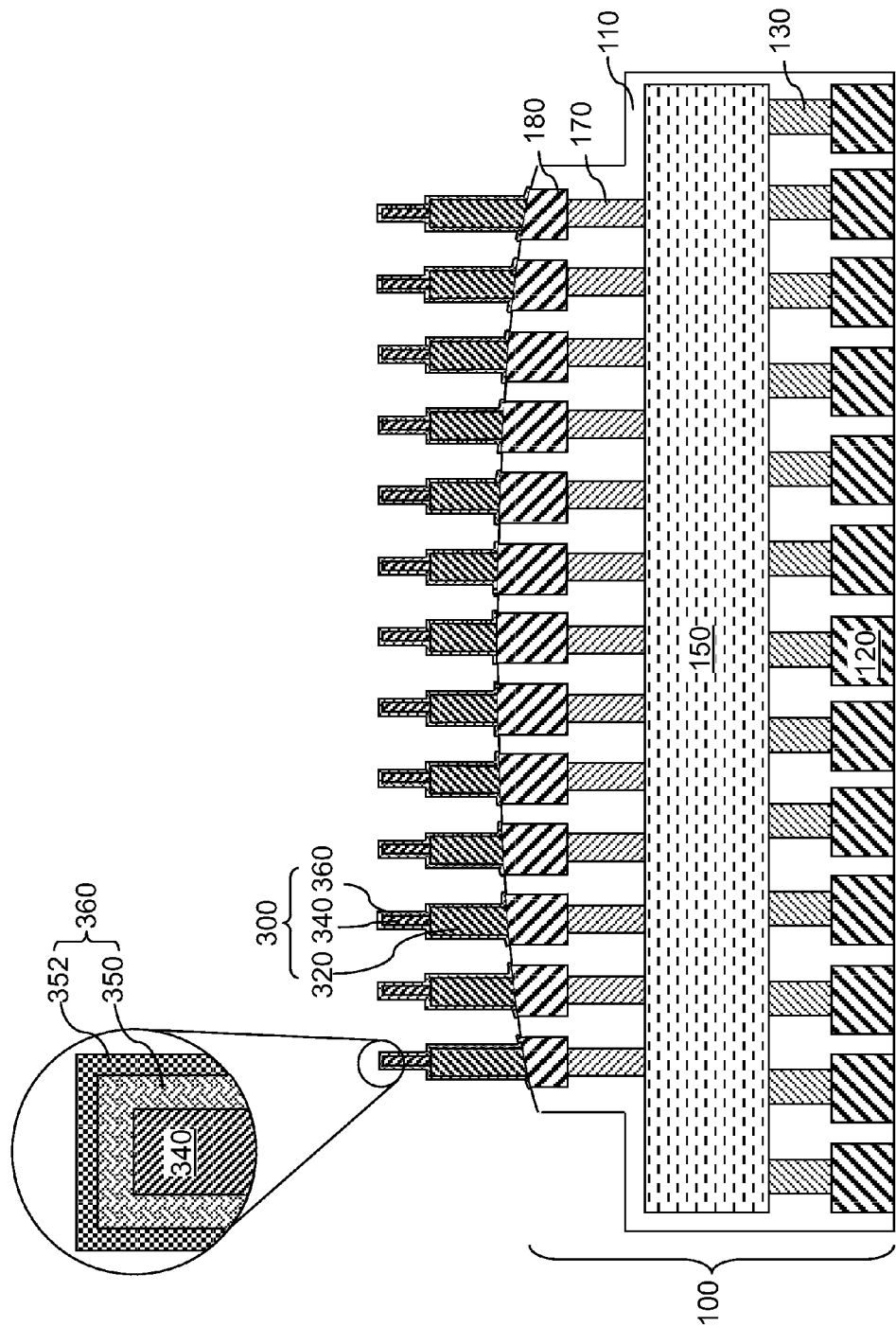
FIG. 8 is a vertical cross-sectional view of the exemplary structure after forming conductive coating layers according to an embodiment of the present disclosure.

Referring to FIG. 8, a conductive coating layer 360 including at least one conductive material can be optionally formed on each conductive probe (320, 340), i.e., on each vertically contacting pair of a first columnar conductive structure 320 and a second columnar conductive structure 340. Upon formation of the conductive coating layers 360, each conductive probe (320, 340, 360) includes a pair of a first columnar conductive structure 320 and a second columnar conductive structure 340 and a conductive coating layer 360.

For each conductive probe (320, 340, 360), the conductive coating layer 360 can be formed on all physically exposed surfaces of the first columnar conductive structure 320 and all physically exposed surfaces of the second columnar conductive structure 340 within the conductive probe (320, 340, 360). Thus, each conductive coating layer 360 contacts all surfaces of the first columnar conductive structure 320 that are not in contact with the substrate 100 or the second columnar conductive structure 340, and contacts all surfaces of the second columnar conductive structure 340 that are not in contact with the first columnar conductive structure 320.

As discussed above, the substrate 100 can include an array of first conductive pads 180 embedded in the dielectric material matrix 110, and the first columnar conductive structure 320 and the conductive coating layer 360 of each conductive probe (320, 340, 360) can be in contact with a first conductive pad 180 among the array of first conductive pads 180. Further, each conductive coating layer 360 can be formed on one of the array of first conductive pads 180.

In one embodiment, the conductive coating layers 360 can be formed by electroplating or electroless plating. The conducive coating layers 360 are formed selectively on metallic surfaces, and do not grow from a dielectric surface. The thickness of the conductive coating layers 360 can be selected to avoid electrically shorting neighboring conductive probes (320, 340, 360), and can be from 500 nm to 10 microns, although lesser and greater thicknesses can also be employed. In one embodiment, the thickness of the conductive coating layers 360 can be from 1 micron to 3 microns.

In one embodiment, the conductive coating layers 360 can be formed by electroplating. In one embodiment, the at least one conductive material of the conductive coating layers 360 can include, for example, nickel, gold, and/or silver. For example, each of the conductive coating layers 360 can include at least one of a nickel layer, a gold layer, a gold-containing alloy layer, a PdCo alloy layer, and a NiCo alloy layer.

In one embodiment, each of the conductive coating layers 360 can include a nickel layer and a gold layer. In one embodiment, each nickel layer can be electrolessly plated directly on the surfaces of a first columnar conductive structure 320, a second columnar conductive structure 340 in contact with the first columnar conductive structure 320, and a first conductive pad in contact with the first columnar conductive structure 320. Subsequently, a gold layer can be electrolessly plated. The nickel layer can have a thickness selected from a range from 500 nm to 5 microns, and the gold layer can have a thickness selected from a range from 100 nm to 2 microns.

Figure 9:
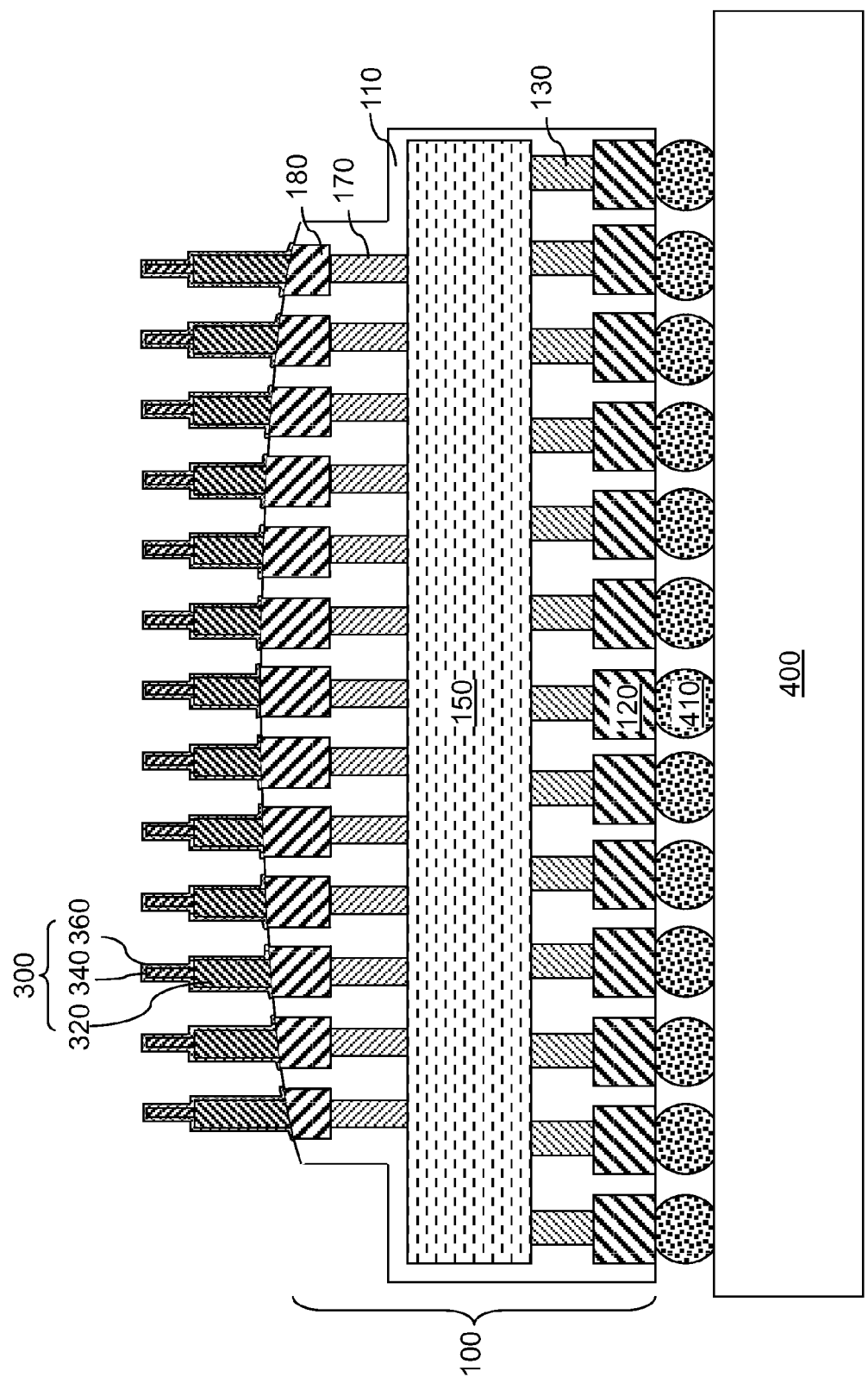
FIG. 9 is a vertical cross-sectional view of the exemplary structure after the substrate is bonded to a test card through an array of solder balls according to an embodiment of the present disclosure.

Referring to FIG. 9, the probing apparatus (100, 320, 340, 360) including the substrate 100 can be attached to a test card 400 or a printed circuit board employing methods known in the art. For example, an array of back side solder balls 410 can be employed to bond the probing apparatus (100, 320, 340, 360) to a test card 400. For example, the array of back side solder balls 410 can be attached to the array of second conductive pads 120. Any other alternate method for attaching the probing apparatus (100, 320, 340, 360) to a test card 400 can also be employed, which include, for example, clipping.

The probing apparatus (100, 320, 340, 360) can be operated by first providing a semiconductor chip (not shown) on which an array of solder balls (not shown; different from the array of back side solder balls 410) is bonded. The array of solder balls on the semiconductor chip can be an array of Controlled Collapse Chip Connect (C4) balls. The array of solder balls on the semiconductor chip can be contacted by the probing apparatus (100, 320, 340, 360) such that at least one solder ball in the array of solder balls can be punctured by the second columnar conductive structures 340.

The height of the second columnar conductive structures 340 can be selected such that the second columnar conductive structures 340 can contact all of the solder balls under all conditions of mechanical and thermal load that can be applied during testing of the semiconductor chip. The top surfaces of the probing apparatus (100, 320, 340, 360), which can be the top surfaces of the conductive coating layers 360 or top surfaces of the second columnar conductive structures 340, can have a coplanarity within a tolerance of +/−2 microns.

The materials and the various dimensions of the first columnar conductive structures 320 and the second columnar conductive structures 340 can be selected so as to provide an electrical resistance for each conductive probe (320, 340, 360) that does not significantly affect accuracy of test data. For example, the effective resistivity of the materials of each conductive probe (320, 340, 360), as measured between the topmost portion and the bottommost portion thereof, can be from 16.78 nΩ·m to 69.3 nΩ19 m at 20° C.

For probing with a rigid probing apparatus, it is necessary that tips of the probing apparatus to break through a surface oxide of solder balls. Further, it is necessary for the tips of the probing apparatus to physically penetrate into the solder balls to ensure that the entire array of probes makes sufficient electrical contact with the solder balls. Thus, the height of the second columnar conductive structures 340 can be selected so as to provide sufficient electrical contact despite variations in planarity and/or flatness variables within a test hardware stack. The probing apparatus (100, 320, 340, 360) according to embodiments of the present disclosure can function as a probe-on-substrate (POS) structure, which can be readily mounted on a test card 400 and employed to test semiconductor chips to which an array of solder balls are attached without using any interposer.

Figure 10:
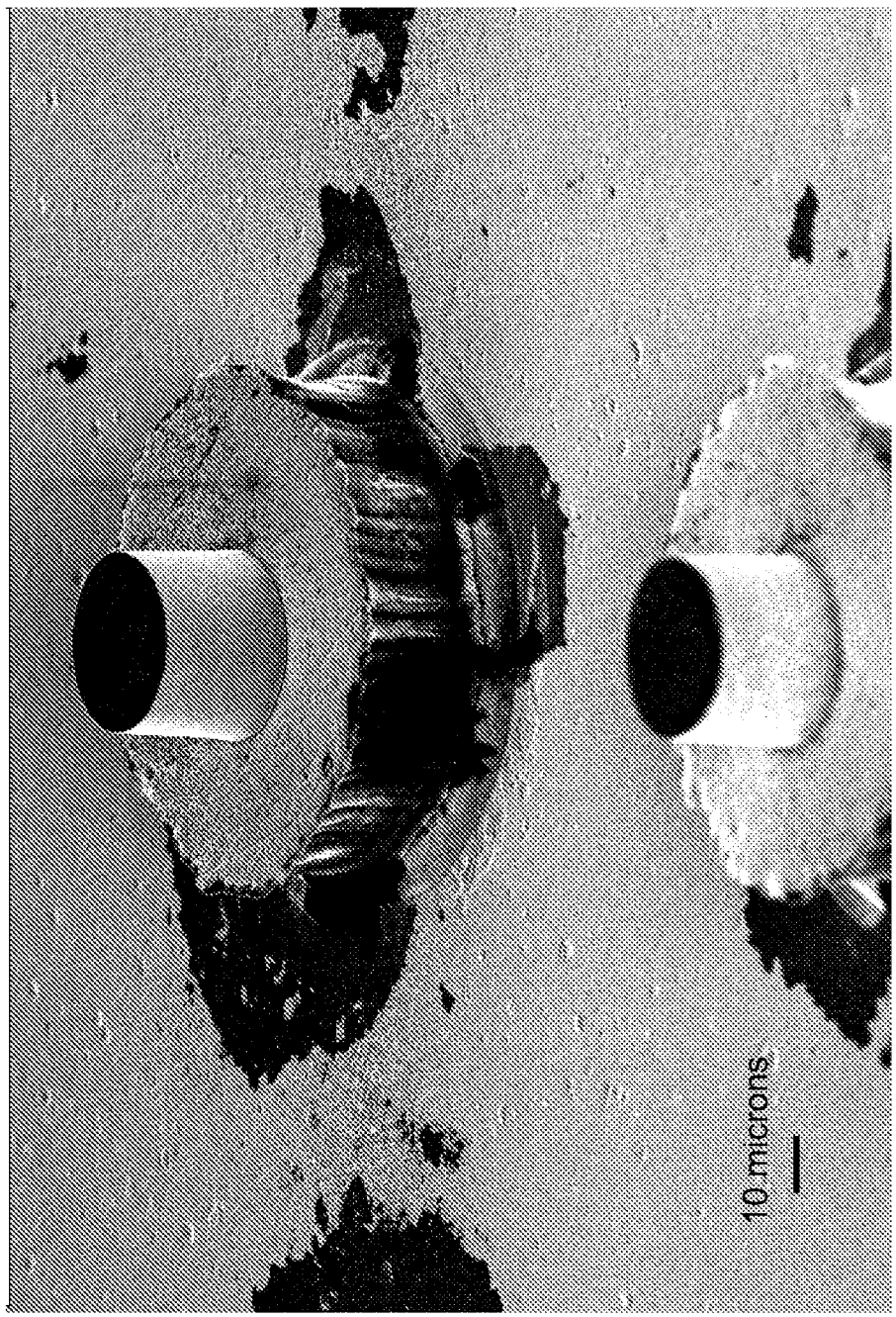
FIG. 10 is a scanning electron micrograph (SEM) of an exemplary probing apparatus manufactured according to an embodiment of the present disclosure.

Referring to FIG. 10, a scanning electron micrograph (SEM) of an exemplary probing apparatus manufactured according to an embodiment of the present disclosure is shown. The first columnar conductive structures 320 and the second columnar conductive structures 340 are cylindrical structures in this exemplary probing apparatus.

Figure 11:
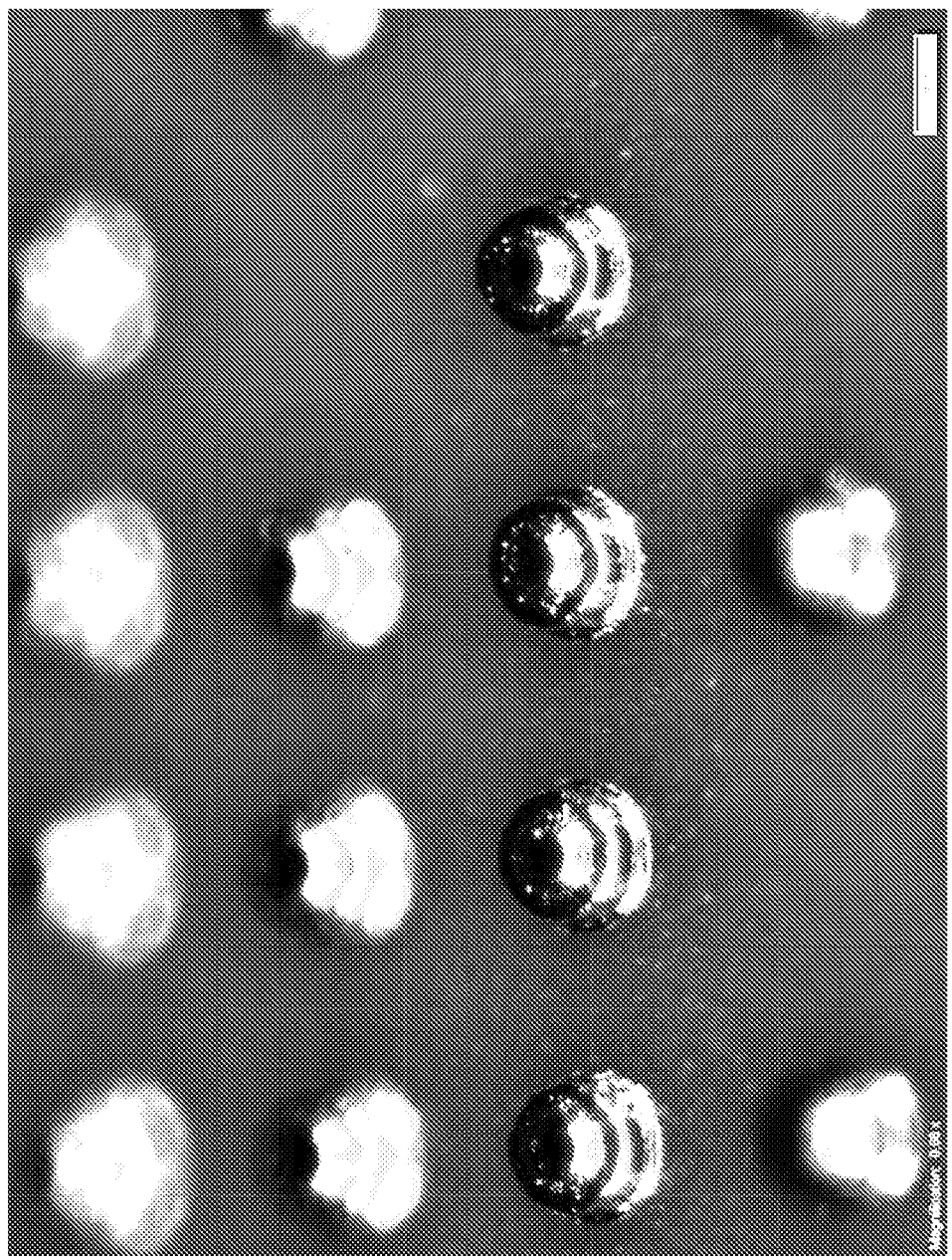
FIG. 11 is a scanning electron micrograph (SEM) of another exemplary probing apparatus manufactured according to an embodiment of the present disclosure.

Referring to FIG. 11, a scanning electron micrograph (SEM) of another exemplary probing apparatus manufactured according to an embodiment of the present disclosure is shown.

In general, a challenge in fabricating a probe-on-substrate structure is to achieve planarity of within a tight specification. The planarity level provided by a ceramic substrate allows probing of a semiconductor chip via a conventional thin film interposer (TFI), which is attached to the ceramic substrate prior to testing and detached from the ceramic substrate after testing. Adding tall columnar structures having a height on the order of 30 microns would introduce additional variation to the planarity of the ceramic substrate as provided. The additional variation to the planarity would cause the tips of tall columnar structures to have vertical variations that are outside the specification for probing equipments. In one embodiment of the present disclosure, the planarization of the first columnar conductive structure at the processing steps of FIGS. 4A and 4B reduces the vertical variations in the conductive probe (320, 340, 360) of the present disclosure. This embodiment provides a method to fabricate multilayer cylindrical structures that are within the planarity specification.

Embodiments of the present disclosure enable elimination of thin film interposers during testing, and thereby reduce the cost of ownership for the probing apparatus (100, 320, 340, 360) of the present disclosure. Further, the probing apparatus (100, 320, 340, 360) of embodiments of the present disclosure simplifies the design of a test equipment by eliminating vacuum pump and other vacuum hardware for holding a thin film interposer. Compared to prior art test hardware employing a thin film interposer, the test hardware employing the probing apparatus (100, 320, 340, 360) of embodiments of the present disclosure does not employ a pedestal for accommodating thin film interposer vacuum hardware, reduces transformer assembly and repair time, and eliminates the need to align a thin film interposer.

In addition, the probing apparatus (100, 320, 340, 360) of embodiments of the present disclosure can support pitched to be employed in the future, which are expected to be smaller than the pitches presently employed for an array of solder balls on a semiconductor chip.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A probing apparatus comprising a plurality of conductive probes located on a top surface of a substrate, wherein each conductive probe within said plurality of conductive probes comprises:
   a first columnar conductive structure having a same first horizontal cross-sectional area between a topmost surface of said first columnar conductive structure and a bottommost surface of said first columnar conductive structure; and
   a second columnar conductive structure located on said topmost surface of said first columnar conductive structure and having a same second horizontal cross-sectional area between a topmost surface of said second columnar conductive structure and a bottommost surface of said second columnar conductive structure,
wherein each conductive probe within said plurality of conductive probes further comprises a conductive coating layer comprising at least one conductive material,
and wherein said conductive coating layer contacts all surfaces of said first columnar conductive structure that are not in contact with said substrate or said second columnar conductive structure, and contacts all surfaces of said second columnar conductive structure that are not in contact with said first columnar conductive structure.

2. The probing apparatus of claim 1, wherein said second horizontal cross-sectional area is less than said first horizontal cross-sectional area.

3. The probing apparatus of claim 1, wherein said first columnar conductive structures of said plurality of conductive probes are first cylindrical conductive structures.

4. The probing apparatus of claim 3, wherein said second columnar conductive structures of said plurality of conductive probes are second cylindrical conductive structures.

5. The probing apparatus of claim 1, wherein said second columnar conductive structures of said plurality of conductive probes have a same height.

6. The probing apparatus of claim 5, wherein said same height is in a range from, and including, 5 microns to, and including, 50 microns.

7. The probing apparatus of claim 5, wherein said same height is in a range from, and including, 10 microns to, and including, 30 microns.

8. The probing apparatus of claim 1, wherein said same second horizontal cross-sectional area is in a range from 25 square microns to 1,000 square microns.

9. The probing apparatus of claim 1, wherein said plurality of conductive probes is arranged as an array of conductive probes having a pitch in at least one direction.

10. The probing apparatus of claim 9, wherein said pitch is in a range from 20 microns to 500 microns.

11. The probing apparatus of claim 9, wherein said array of conductive probes is a two-dimensional array having a first pitch in a first direction and a second pitch in a second direction that is different from the first direction.

12. The probing apparatus of claim 1, wherein all topmost surfaces of said first columnar conductive structures are within a horizontal plane, and said top surface of said substrate is curved.

13. The probing apparatus of claim 1, wherein said first columnar conductive structures have variations in height.

14. The probing apparatus of claim 1, wherein said second columnar conductive structures have a same height.

15. The probing apparatus of claim 1, wherein each of said first columnar conductive structure and said second columnar conductive structure comprises at least one of Cu, Ni, Pd, Ni, Co, and alloys thereof.

16. The probing apparatus of claim 1, wherein said substrate comprises an array of first conductive pads embedded in a dielectric material matrix, and said first columnar conductive structure and said conductive coating layer are in contact with a first conductive pad among said array of first conductive pads.

17. The probing apparatus of claim 16, wherein said conductive coating layer comprises at least one of a nickel layer, a gold layer, a gold-containing alloy layer, a PdCo alloy layer, and a NiCo alloy layer.

18. The probing apparatus of claim 16, wherein conductive coating layer comprises a nickel layer and a gold layer, said nickel layer has a thickness from 500 nm to 5 microns, and said gold layer has a thickness from 100 nm to 2 microns.

19. The probing apparatus of claim 1, wherein said substrate is a ceramic substrate.

20. The probing apparatus of claim 1, wherein said substrate comprises an array of first conductive pads embedded in a dielectric material matrix, and a first surface of said substrate comprises surfaces of said array of first conductive pads.

21. The probing apparatus of claim 20, wherein each conductive probe within said plurality of conductive probes is in contact with a surface of a first conductive pad in said array of first conductive pads.

22. The probing apparatus of claim 21, wherein said substrate further comprises an array of second conductive pads embedded in said dielectric material matrix, and surfaces of said array of second conductive pads are physically exposed on a second surface of said substrate, said second surface being located on an opposite side of said first surface of said substrate.

23. The probing apparatus of claim 22, wherein said substrate further comprises metal interconnect structures embedded in said dielectric material matrix and providing electrical connections between said array of first conductive pads and said array of second conductive pads.

\* \* \* \* \*